(12) United States Patent
Lesso et al.

(10) Patent No.: US 9,866,180 B2
(45) Date of Patent: Jan. 9, 2018

(54) AMPLIFIERS

(71) Applicant: Cirrus Logic International Semiconductor Ltd., Edinburgh (GB)

(72) Inventors: John Paul Lesso, Edinburgh (GB); Emmanuel Philippe Christian Hardy, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 58 days.

(21) Appl. No.: 14/707,846

(22) Filed: May 8, 2015

(65) Prior Publication Data

US 2016/0329867 A1 Nov. 10, 2016

(51) Int. Cl.
| | |
|---|---|
| *H03F 1/26* | (2006.01) |
| *H03F 1/32* | (2006.01) |
| *H03F 3/183* | (2006.01) |
| *H04R 3/08* | (2006.01) |
| *H04R 5/04* | (2006.01) |
| *H04R 29/00* | (2006.01) |

(52) U.S. Cl.
CPC ......... *H03F 1/3241* (2013.01); *H03F 1/3258* (2013.01); *H03F 1/3264* (2013.01); *H03F 3/183* (2013.01); *H04R 3/08* (2013.01); *H04R 5/04* (2013.01); *H04R 29/003* (2013.01); *H03F 2200/03* (2013.01); *H03F 2201/3233* (2013.01); *H04R 2420/03* (2013.01); *H04R 2460/03* (2013.01)

(58) Field of Classification Search
CPC ........................................................ H03F 1/26
USPC ........................................................ 330/149
See application file for complete search history.

(56) References Cited

U.S. PATENT DOCUMENTS

| | | | | |
|---|---|---|---|---|
| 5,815,585 | A | | 9/1998 | Klippel |
| 5,903,823 | A | * | 5/1999 | Moriyama ............. H01Q 3/267 330/149 |

(Continued)

FOREIGN PATENT DOCUMENTS

| | | |
|---|---|---|
| EP | 0340762 A2 | 11/1989 |
| EP | 1523218 A1 | 4/2005 |

(Continued)

OTHER PUBLICATIONS

Combined Search and Examination Report under Sections 17 and 18(3), Application No. GB1515584.9, dated Mar. 2, 2016, 6 pages.

(Continued)

*Primary Examiner* — Patricia T Nguyen
(74) *Attorney, Agent, or Firm* — Jackson Walker L.L.P.

(57) ABSTRACT

This application relates to audio amplifier circuitry (100). An amplifier module (103) is located in a signal path between an input (101) and an output (102). A detection module (106) is configured to detect a characteristic of a load (104) electrically coupled, in use, to the output. A distortion setting controller (107) is provided for selecting one of a plurality of stored distortion settings {$p_i$} based on the detected characteristic of the load; and a pre-distortion module (105) is configured to apply a first transfer function to a signal in the signal path prior to said amplifier module. The first transfer function is based on the selected distortion setting and for at least one of the stored distortion settings the corresponding first transfer function comprises a non-linear distortion function.

14 Claims, 3 Drawing Sheets

(56) References Cited

U.S. PATENT DOCUMENTS

| | | | |
|---|---|---|---|
| 7,917,105 B2* | 3/2011 | Drogi | H03F 1/0205 455/126 |
| 2006/0104451 A1 | 5/2006 | Browning et al. | |
| 2009/0041474 A1* | 2/2009 | Ishaug | H04B 10/504 398/193 |
| 2011/0095819 A1* | 4/2011 | Velazquez | H03F 1/3247 330/149 |
| 2015/0015327 A1* | 1/2015 | Glock | H03F 1/3258 330/149 |
| 2015/0120219 A1* | 4/2015 | Merlin | H04B 1/0458 702/58 |
| 2015/0155835 A1* | 6/2015 | Al-Qaq | H03F 1/3241 375/296 |
| 2015/0236729 A1* | 8/2015 | Peng | H04B 1/0475 455/114.3 |

FOREIGN PATENT DOCUMENTS

| | | |
|---|---|---|
| EP | 2453670 A1 | 5/2012 |
| WO | 2006020503 A2 | 2/2006 |
| WO | 2006132988 A1 | 12/2006 |
| WO | 2008016531 A2 | 2/2008 |

OTHER PUBLICATIONS

International Search Report and Written Opinion of the International Searching Authority, International Application No. PCT/GB2016/051272, dated Oct. 5, 2016.

* cited by examiner

AMPLIFIERS

FIELD OF DISCLOSURE

This application relates to methods and apparatus for amplification of signals, and especially to audio amplifiers, and in particular to amplifiers that may be used to drive different types of load.

BACKGROUND

Various electronic devices have audio driver, i.e. amplifier, circuitry for driving an audio signal to an audio load, e.g. a loudspeaker, and often devices may have a connector, in the form of a plug and socket for example, for outputting audio signals to an external device. The external device could be a peripheral device such as a headset with relatively small loudspeakers, e.g. located in earphones or earbuds or the like. Such headset loudspeakers will typically have a relatively low impedance, say of the order of a few ohms or so. Additionally however it is often desired that the same audio driver circuitry can be used to drive higher impedance loudspeakers when connected, say of the order of a few hundred ohms or so. It is also desirable for the same audio driver circuitry to be able to drive a line load of the order of a few kilo-ohms or more via the audio connector, e.g. when connected to a suitable audio system, which may for instance be part of a docking arrangement. Thus the audio driver circuitry should be capable of driving different types of load.

For high quality sound reproduction the distortion of the audio signal, especially THD (total harmonic distortion) and intermodulation distortion, should be low. Various factors may contribute to distortion in an amplifier circuit driving a load. Typically the distortion is worst for lower impedance loads. An amplifier may be designed to maintain adequately low distortion into a low impedance load by increasing the output stage quiescent current, generally requiring larger output devices and higher current pre-driver stages. Distortion may also be managed by designing the amplifier circuitry with multiple amplifier stages to attempt to suppress output distortion by a high open loop amplifier gain. However these approaches generally increase both the power consumption of the amplifier circuitry and the size and complexity, and hence cost, of the circuitry.

For many electronic devices, e.g. especially for battery powered devices where power demands impact on battery life, power efficiency of the components of the device may be a concern. Higher power consumption may also have associated cooling requirements. The size and cost of components are also of concern for such applications.

SUMMARY

Thus according to the present invention there is provided audio amplifier circuitry comprising:
  an amplifier module located in a signal path between an input and an output;
  a detection module for detecting a characteristic of a load electrically coupled, in use, to the output;
  a distortion setting controller for selecting one of a plurality of stored distortion settings based on the detected characteristic of the load; and
  a pre-distortion module configured to apply a first transfer function to a signal in the signal path prior to said amplifier module, wherein the first transfer function is based on the selected distortion setting;
  wherein for at least one of the stored distortion settings the corresponding first transfer function comprises a non-linear distortion function.

The first transfer function may be based on a polynomial function. Each of the stored distortion settings may comprise a set of one or more distortion coefficients for the polynomial function. Each distortion setting may comprise a set of distortion coefficients characterised for a particular load characteristic. In some embodiments at least some distortion coefficients may have an associated phase delay component and the pre-distortion module may be configured to apply a distortion component corresponding to each distortion coefficient at a respective delay indicated by the respective phase delay component.

For one of the stored distortion settings the corresponding first transfer function may correspond to substantially no distortion. For a plurality of the stored distortion settings the corresponding first transfer functions may comprise a non-linear distortion function, wherein different distortion settings correspond to different non-linear distortion functions.

In some embodiments the audio amplifier circuitry may further comprise a storage module for storing the plurality of distortion settings. The storage module may comprise a look-up table.

The characteristic of the load that is determined may be the impedance of the load. In some embodiments the distortion setting controller may be configured to compare the impedance of the load with one or more threshold values to determine an impedance band for the load and to select one of the stored distortion settings that is appropriate for said impedance band.

The detection module may be coupled to the output of the amplifier circuitry. The detection module may be configured to determine the characteristic of the load through monitoring of the electrical properties at the output when a load is connected. The detection module may be configured to detect when a load is operably connected to the output and then to determine the characteristic of the load. In response to a detection that a load has been operably connected to the output, the amplifier circuitry may be configured to apply a test stimulus to the output and the detection module may be configured to monitor of the electrical properties at the output in response to the test stimulus to determine the characteristic of the load.

The detection module may be configured to, in use, continuously or periodically monitor the characteristic of the load. When the detection module is monitoring the characteristic of the load, the amplifier circuitry may be configured to add a pilot tone at a pilot tone frequency to the signal in the signal path. The detection module may monitor the electrical properties at the output at said pilot tone frequency. The pilot tone frequency may be below a low frequency threshold corresponding to an expected low frequency cut off for the possible loads.

In some embodiments the distortion setting controller is configured such that the selection of the one of the stored plurality of distortion settings is also based on an indication of at least one operating condition of the amplifier circuitry. In some embodiments the distortion setting controller may be configured to modify the selected distortion setting based on an indication of at least one operating condition of the amplifier circuitry. The at least one operating condition of the amplifier circuitry comprises temperature of the amplifier circuitry and/or the at least one operating condition of the amplifier circuitry may comprise at least one of: a supply voltage; a bias current; an amplifier operating mode.

In some embodiments the distortion setting controller is configured, such that, in the event that the selected distortion setting is changed in use, the distortion setting controller transitions from the old distortion setting to the new distortion setting via at least one intermediate setting value.

In some embodiments the pre-distortion module comprises a digital signal processor.

The audio amplifier circuitry may be implemented as an integrated circuit and aspects relate to an integrated circuit comprising audio amplifier circuitry in any of the variants described above.

Aspects also relate to an electronic device comprising audio amplifier circuitry as described in any of the above variants. The output of the audio amplifier circuitry may be connected to an audio connector of the electronic device, the audio connector being configured for mating connection with a corresponding connector of a peripheral device. The electronic device may be at least one of: a communications device; a computing device; a portable device; a battery powered device; a wearable device; a gaming device; a mobile telephone; a laptop, notebook or tablet computer.

Aspects also relate to a method of operating an audio amplifier circuit comprising:

detecting a characteristic of a load electrically coupled, in use, to an output of the audio amplifying circuit;

selecting one of a plurality of stored distortion settings based on the detected characteristic of the load; and applying a first transfer function to a signal received at an input to the audio amplifier circuit, wherein the first transfer function is based on the selected distortion setting and for at least one of the stored distortion settings the corresponding first transfer function comprises a non-linear distortion function; and amplifying the signal to which the first transfer function has been applied and outputting the amplified signal to said output of the audio amplifying circuit.

The method may be implemented in any of the variants described above.

Aspects also relate to a method of determining a pre-distortion for compensating for inherent distortion in an amplifier module, the method comprising:

connecting the amplifier module to a defined impedance;

supplying a predetermined test signal to an input of the amplifier module and monitoring an output signal from the amplifier module;

analysing the output signal to determine the amplitude and polarity of the harmonic coefficients for a plurality of the first harmonic components;

transforming the harmonic coefficients into distortion coefficients of a polynomial function corresponding to a distortion transfer function of the amplifier module; and inverting the distortion coefficients to provide pre-distortion coefficients for a pre-distortion for compensating for said distortion transfer function of the amplifier module.

In a further aspect there is provided an audio amplifier circuitry comprising:

an amplifier module for receiving an input digital signal and producing an amplified analogue output signal; and a pre-distortion module for applying a first transfer function to the digital input signal upstream of the amplifier module;

wherein the first transfer function is variable based on an indication of the impedance of a load coupled, in use, to an output of the amplifier module and for at least some load impedances the first transfer function comprises a non-linear distortion.

In a further aspect there is provided an audio amplifier circuitry for receiving an input signal and outputting an output signal to an output, comprising:

a storage module for storing a plurality of distortion settings;

a controller for selecting one of the plurality of distortion settings based on an indication of a characteristic of the load coupled, in use, to the output; and a pre-distort module applying a distortion function to the input signal based on the selected distortion setting.

BRIEF DESCRIPTION OF THE DRAWINGS

Embodiments will now be described by way of example only with reference to the accompanying drawings, of which.

DETAILED DESCRIPTION

Embodiments of the invention provide amplifier circuitry and methods of amplification that exhibit good distortion performance, across a range of different possible load impedances, but which do not require relatively large active devices or relatively high bias currents. In embodiments of the invention, for at least some loads, a first transfer function which implements a controlled distortion is applied to an input signal to compensate for the expected distortion when driving a particular load.

Different types of load may present different impedances, for example as illustrated in the following table.

TABLE 1

| Example Load Type | Example Load Device | Example Impedance Band |
|---|---|---|
| 1 | Earbuds | Z < 100 Ω |
| 2 | Headphones | Z ≥ 100 < 1000 Ω |
| 3 | Lineout | Z ≥ 1000 Ω |

The controlled distortion implemented by the first transfer function is thus a pre-distortion of the input signal and is tailored to the particular type of load which is being driven. Embodiments therefore detect a characteristic of the load being driven and control at least one distortion setting of the first transfer function which is applied based on the detected characteristic of the load. Different distortion settings leads to different transfer functions, at least one of which is a non-linear distortion function.

Figure 1:
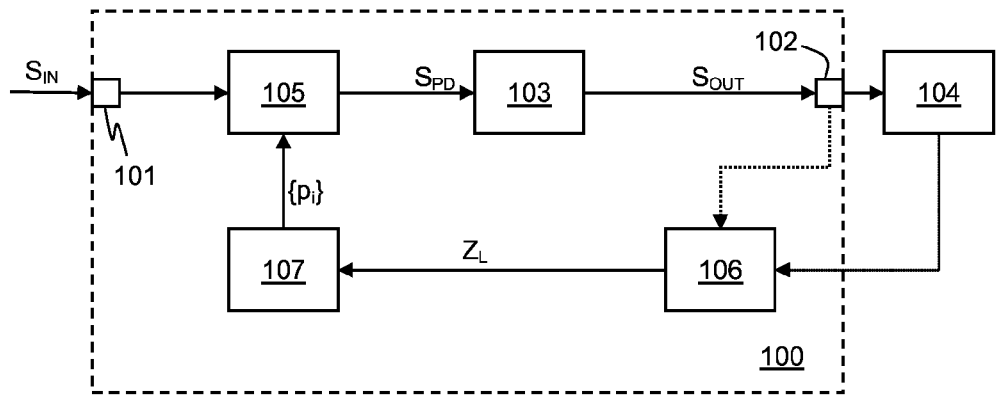
FIG. 1 illustrates an amplifier circuit according to an embodiment of the invention.

FIG. 1 illustrates generally an amplifier circuit 100 according to an embodiment. The amplifier circuit comprises an input 101 for receiving an input signal $S_{IN}$, which may typically be a digital audio signal. The amplifier circuit also has an output 102 for outputting the output audio signal $S_{OUT}$ which will generally be an analogue audio signal. Located in the signal path between the input 101 and the output 102 is an amplifier module 103 for amplifying the signal it receives. The amplifier module will comprise at least one amplifier stage and, depending on the type of amplifier, may typically include a DAC (digital-to-analogue converter) to convert the received digital signal into an analogue signal prior to amplification. In the embodiment illustrated in FIG. 1 the output of the amplifier module 103 is the output signal $S_{OUT}$ which is used to drive a load 104 which, in use, is electrically connected to the output 102 of the amplifier circuit. The load 104 may be a load which is external to the host device, i.e. the device in which the amplifier circuit is embodied, and which is removably connected via a suitable removable connector, e.g. a jack plug-and-socket or plug-and-receptacle type arrangement. A load 104 that may be connected may, for instance, be a loudspeaker of a headset connected to the host device or a loudspeaker of a connected docking station.

The embodiment of FIG. 1 also has a pre-distortion module 105 configured to apply a first transfer function to a signal in the signal path, i.e. between the input 101 and output 102. Conveniently the first transfer function is applied in the digital domain and may thus be applied in the signal path upstream of the amplifier module 103. The first transfer function may, for a particular load, apply a controlled distortion. As illustrated in FIG. 1 the controlled distortion may be applied to the input signal SIN to generate a pre-distorted version of the input signal SPD which is passed to the amplifier module 103. The first transfer function may, for at least some loads, be a non-linear distortion and is based on at least one distortion setting, for example a set of one or more distortion coefficients $\{pi\}$ for a polynomial function. The controlled distortion applied by the pre-distortion module 105 is chosen so as to compensate for at least some of the downstream distortion that will be experienced when driving the load 104. The controlled distortion applied thus compensates or corrects for the inherent distortion of the downstream signal that will be experienced due to the non-linearity of the amplifier components. The controlled distortion distorts the original input signal SIN in such a way that the subsequent inherent distortion experienced actually reduces the total distortion in the final output signal SOUT. In other words the audio signal applied to the load will exhibit lower distortion than otherwise would be the case without the controlled distortion applied by the pre-distortion module 105.

However, the extent of the inherent distortion of the audio signal during amplification when driving a load may vary depending on the type of load connected. For example, for a given amplifier design, it may be worse when driving lower impedance loads. Thus any controlled distortion implemented by the first transfer function which is chosen so as to substantially cancel amplifier distortion with one type of load applied, i.e. when driving a load of a first impedance, may not correctly cancel the distortion when a different type of load is applied, i.e. when driving a load of a second, different, impedance. For applications where the load is detachably connected, for example in the case of a headset connection to a mobile phone or suchlike, the use of the same audio amplifier to drive different types of loads of different impedance, with resulting different distortions, is possible and quite likely.

Thus in order to correctly distort, i.e. pre-distort the input signal, so as to improve the distortion characteristic at the load, the first transfer function, and hence the controlled distortion, applied by the pre-distortion module 105 depends on at least one characteristic of the load, i.e. the applied pre-distortion is load dependent. Thus a detection module 106 may be configured to detect the relevant characteristic of the connected load, which may, for instance, be the impedance of the load ZL or a characteristic indicative of impedance. The detection module may also detect the presence of the load.

In some embodiments the detection module 106 may be coupled to the output 102 of the amplifier circuitry and may be configured to determine the characteristic of the load through monitoring and/or testing the electrical properties at the output 102 when a load is connected. However in some embodiments the detection module 106 may simply receive an indication of the relevant characteristic, for instance from the load 104 itself via some suitable communication pathway or from some other part of the host device that determines the characteristic of the load 104. In other words, the load 104 may comprise pre-programmed information about its characteristics that may be read by the host device via the plug and socket interface 102.

As mentioned, the at least one distortion setting is based on the detected characteristic of the load 104. Thus a distortion setting controller may determine through monitoring and/or testing or receive an indication of the characteristic of the load and subsequently determine an appropriate distortion setting. In some embodiments the distortion setting, which may comprise a set of distortion coefficients $\{pi\}$ as will be explained in more detail later, may be based on a plurality of stored settings based on the detected characteristic. In other words there may be a plurality of stored distortions settings that have been characterised for different load characteristics. In use the characteristic of the load may be detected and used to generate an appropriate distortion setting. In some embodiments this may comprise selecting the most appropriate stored distortion setting. Thus the distortion setting controller 107 may provide an appropriate set of pre-distortion coefficients $\{pi\}$ to the pre-distortion module 105 based on the detected characteristic of the load.

The pre-distortion module 105 may apply the controlled distortion according to a polynomial function and the at least one distortion setting may therefore comprise a set of coefficients for polynomial distortion. In other words the first transfer function of the pre-distortion module may be a polynomial function.

Referring to FIG. 1 consider that the input value SIN has an instantaneous value of x. The distortion inherent in the amplifier driver circuitry, e.g. the distortion introduced by amplifier module 103, effectively results in a non-linearity of amplification. The inherent distortion in the amplifier signal path can be reasonably modelled as a polynomial distortion, and can be substantially cancelled by applying a suitable polynomial pre-distortion as the first transfer function.

For example consider that the amplifier transfer function k(x) including distortion can be approximated as:

$$k(x) = x + k_2 \cdot x^2 + k_3 \cdot x^3 \qquad \text{Eqn. (1)}$$

If the controlled pre-distortion is controlled according to:

$$p(x) = x + p_2 \cdot x^2 + p_3 \cdot x^3 \qquad \text{Eqn. (2)}$$

then the output derived by cascading k(x) after p(x) is:

$$\begin{aligned} k(p(x)) &= p(x) + k_2 \cdot (p(x))^2 + k_3 \cdot (p(x))^3 \\ &= x + p_2 \cdot x^2 + p_3 \cdot x^3 + \\ &\quad k_2 \cdot (x + p_2 \cdot x^2 + p_3 \cdot x^3)^2 + \\ &\quad k_3 \cdot (x + p_2 \cdot x^2 + p_3 \cdot x^3)^3 \end{aligned} \qquad \text{Eqn. (3)}$$

If $p_2$ and $p_3$ are chosen such that $p_2=-k_2$ and $p_3=2.k_2{}^2-k_3$, then:

$$k(p(x)) = x - k_2 \cdot x^2 + (2 \cdot k_2^2 - k_3) \cdot x^3 +$$  Eqn. (4)
$$k_2 \cdot (x - k_2 \cdot x^2 + (2 \cdot k_2^2 - k_3) \cdot x^3)^2 +$$
$$k_3 \cdot (x - k_2 \cdot x^2 + (2 \cdot k_2^2 - k_3) \cdot x^3)^3$$
$$= x + x^2(-k_2 + k_2) + x^3(2 \cdot k_2^2 - k_3 + 2 \cdot k_2^2 + k_3) +$$
$$O(x^4)$$
$$= x + O(x^4)$$

where $O(x^4)$ indicates all terms of power $x^4$ or higher.

Thus it can be seen that all the second and third order effects of the distortion are cancelled and only some small higher order terms remain.

In general this method can be expanded for higher order cancellation, i.e. the distortion may be modelled by:

$$k(x)=k_1.x+k_2.x^2+k_3.x^3+\ldots+k_N.x^N$$  Eqn. (5)

and the controlled pre-distortion, i.e. the first transfer function, may be applied according to:

$$p(x)=p_1.x+p_2.x^2+p_3.x^3+\ldots+p_N.x^N$$  Eqn. (6)

Values of $p_1, p_2 \ldots p_N$ are summarised below for N up to 8.

TABLE 2

$p_1$  $1/k_1$
$p_2$  $-(k_2.p_1{}^2)/k_1$
$p_3$  $-(k_3. p_1{}^3 + 2. k_2.p_2. p_1)/k_1$
$p_4$  $-(k_2.(p_2{}^2 + 2. p_1. p_3) + k_4. p_1{}^4 + 3. k_3. p_1{}^2. p_2)/k_1$
$p_5$  $-(k_5. p_1{}^5 + k_3.(p_1.(p_2{}^2 + 2. p_1. p_3) + 2. p_1. p_2{}^2 + p_1{}^2. p_3) + k_2.(2. p_1. p_4 + 2. p_2. p_3) + 4. k_4. p_1{}^3. p_2)/k_1$
$p_6$  $-(k_3.(p_2.(p_2{}^2 + 2. p_1. p_3) + p_1{}^2. p_4 + p_1.(2. p_1. p_4 + 2. p_2. p_3) + 2. p_1. p_2. p_3) + k_4.(p_1{}^3. p_3 + p_1.(p_1.(p_2{}^2 + 2. p_1. p_3) + 2. p_1. p_2{}^2 + p_1{}^2. p_3) + 3. p_1{}^2. p_2{}^2) + k_2.(p_3{}^2 + 2. p_1. p_5 + 2. p_2. p_4) + k_6. p_1{}^6 + 5. k_5. p_1{}^4. p_2)/k_1$
$p_7$  $-(k_7. p_1{}^7 + 6. k_6. p_1{}^5. p_2 + 5. k_5. p_1{}^4. p_3 + 10. k_5. p_1{}^3. p_2{}^2 + 4. k_4. p_4. p_1{}^3 + 12. k_4. p_1{}^2. p_2. p_3 + 3. k_3. p_5. p_1{}^2 + 4. k_4. p_1. p_2{}^3 + 6. k_3. p_4. p_1. p_2 + 3. k_3. p_1. p_3{}^2 + 2. k_2. p_6. p_1 + 3. k_3. p_2{}^2. p_3 + 2. k_2. p_5. p_2 + 2. k_2. p_4. p_3)/k_1$
$p_8$  $-(k_8. p_1{}^8 + 7. k_7. p_1{}^6. p_2 + 6. k_6. p_1{}^5. p_3 + 15. k_6. p_1{}^4. p_2{}^2 + 5. k_5. p_1{}^4. p_4 + 20. k_5. p_1{}^3. p_2. p_3 + 4. k_4. p_5. p_1{}^3 + 10. k_5. p_1{}^2. p_2{}^3 + 12. k_4. p_1{}^2. p_2. p_4 + 6.k_4.p_1{}^2. p_3{}^2 + 3. k_3.p6. p_1{}^2 + 12. k_4. p_1. p_2{}^2. p_3 + 6. k_3. p_5. p_1. p_2 + 6. k_3. p_1. p_3. p_4 + 2. k_2. p_7. p_1 + k_4.p_2{}^4 + 3. k_3.p_2{}^2. p_4 + 3. k_3. p_2. p_3{}^2 + 2. k_3. p_6. p_2 + 2. k_3. p_5. p_3 + k_3. p_4{}^2)/k_1$

In general k1 will equal one, although other scaling factors may be used as appropriate and understood by those skilled in the art. Embodiments of the invention may therefore have a set of stored pre-distortion coefficients {pi}, for each of a plurality of different inherent distortion characteristics k(x). Detecting a characteristic of the load effectively identifies the inherent distortion characteristic k(x) that will be expected in use and thus allows selection of the appropriate stored pre-distortion coefficients for reducing or cancelling that inherent distortion. The distortion setting controller 107 may therefore be seen as a distortion coefficient generator or selector module.

Figure 2:
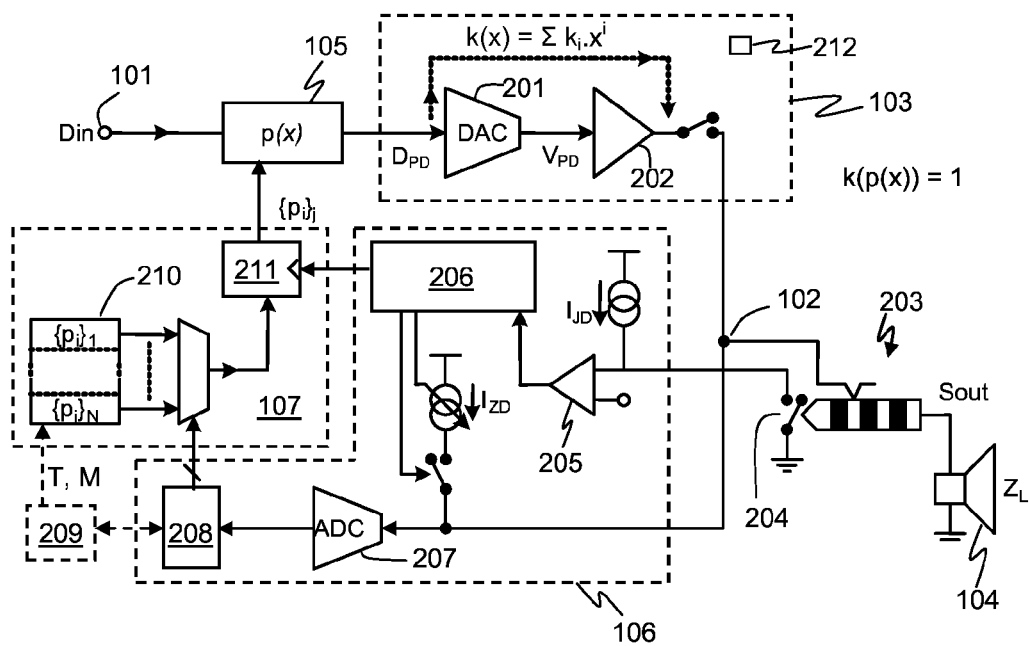
FIG. 2 illustrates an embodiment of the invention in more detail.

FIG. 2 illustrates an embodiment of the invention in more detail than FIG. 1, where similar components are identified using the same reference numerals. FIG. 2 again illustrates that an amplifier module 103 may be located in a signal path between an input 101 and an output 102. The amplifier module may comprise a DAC 201 and an amplifier 202.

In use a load 104, such as a loudspeaker may be electrically connected to the output 102, possibly via a plug-and-socket type connection 203. The plug-and-socket arrangement may, for example be a conventional 3- or 4-pole 3.5 mm or 2.5 mm jack plug-and-socket and may have connections for driving stereo audio signals. The connection to the load 104 could however comprise any suitable connection for output of analogue audio signals and may comprise a multi-pole connector such as a USB Type-C connector operating for example in Analog Audio Adapter Mode or similar.

The DAC 201 may be any suitable DAC and may for instance be a switched capacitor DAC or a current-steering DAC or a PWM (Pulse Width Modulation) DAC. The driver amplifier 202 may, for example, be a Class AB or Class G amplifier with feedback such as would be well understood in the art. However embodiments may equally be implemented with other types of amplifier, for example Class D stages, either closed loop—with analogue feedback—or open-loop or all digital Class D. The DAC and driver amplifier functions may be combined into one circuit, for example an amplifier powerful enough to drive specified loads with some switched-capacitor circuitry in feedback around it.

Each of the DAC 201 and the amplifier 202 may have non-linear properties that could lead to a distortion or voltage error in the output signal SOUT. The level of the voltage error will depend however on the impedance ZL of the connected load 104. For low impedance loads such as low impedance loudspeakers, the distortion may be dominated by the non-linearity of the amplifier. For higher impedance loads, driving lower currents, the amplifier may be more linear, but the DAC may still contribute significant distortion, particularly as a higher signal voltage swing may be specified into higher impedance loads such as line loads. The overall expected distortion characteristic k(x) of the amplifier module is thus load dependent.

The detection module 106 in this example is an impedance detection module which may be coupled to the output 102 to determine the impedance of the connected load. The detection module 106 may detect when a load is operably connected, for instance when a suitable connection to an external device is established, e.g. a jack plug is inserted into the socket or at power-up or reset of the audio amplifier circuit. The detection module may for instance detect that insertion of jack plug closes a normally open switch 204 inside the jack socket, causing the input of a comparator 205 to go low. The comparator going low is signalled to detection module controller 206 indicating that a load has been connected.

It will be understood that there are various other ways in which connection of a load may be detected and/or detection of the connection of a load could be performed elsewhere and signalled to an impedance detection module. Additionally the plug insert detection may involve extra steps or extra hardware: for instance in the case of USB Type-C, it may involve not only detection that a plug has been attached, but also measurement of various resistances in the attached accessory to determine that it is operating in an analogue signal mode, rather than a digital signal transmission mode Once it is signalled, by any means, that a load is connected, the detection module determines the impedance of the load connected to the output 102 via a relevant pole of the connector. In the example illustrated in FIG. 2 a known DC current IZD may be applied to the relevant pole and the resultant voltage measured via an ADC 207. The output from the ADC 207 may be supplied to a selector 208 which determines which of a number of predefined impedance bands the presently connected load falls into. The selector 208 may for instance compare the output from the ADC 207 against one or more predefined thresholds to determine the relevant impedance band, i.e. the type of load connected.

Standard nominal load impedance values for headsets include 8 ohms, 16 ohms, 32 ohms, 600 ohms and 10 kohms. In some embodiments there may thus be five impedance bands each including or centred on one of these values. This may also provide adequate performance for loads of intermediate values. In other embodiments there may be more or fewer impedance bands according to the distortion performance of the particular amplifier design and the amount of distortion cancellation required. At least some of the impedance bands may be logarithmically equally spaced, for example 8, 16 and 32 ohms.

In some embodiments there may be one or more impedance bands in which no pre-distortion is applied, equivalent to $p(x)=1$. This may avoid needless manipulation of the signal, for example to save power or to avoid possible degradation of the signal. In some embodiments there may be only two impedance bands, and pre-distortion is applied for impedances in a first band and no pre-distortion is applied for impedances in the second band. In other words for one of the stored distortion settings the corresponding first transfer function corresponds to substantially no distortion. There will however be at least one distortion setting for which the corresponding first transfer function comprises a non-linear distortion function. In some embodiments there may be a plurality of different distortion settings that give rise different first transfer functions which correspond to different non-linear distortion functions characterised for a particular load characteristic.

For amplifier circuitry with stereo audio output drive circuitry, and thus two poles of a suitable connector driven by audio amplifiers, the impedance of each loudspeaker may be determined separately. However in some applications it may be sufficient to determine the impedance of a load connected to just one of the relevant poles, i.e. to determine the impedance of just one of the loudspeakers, with the assumption being made that the other loudspeaker has a similar impedance value.

It will also be appreciated that there are a variety of ways in which the impedance of the loudspeaker may be detected. The applied current could be modulated in some way, e.g. ramped or stepped in a known way and the resultant voltage could monitored using a multi-bit or one-bit, i.e. comparator, quantisation. The current could otherwise be modulated with time e.g. square wave or ultrasonic carrier amplitude. A test voltage may be applied (small and gradually to avoid audible artefacts) and the resulting current detected and digitised or compared. The test signal may be sourced from the amplifier module 103 or selected elements thereof such as high-side drive transistor.

Figure 5:
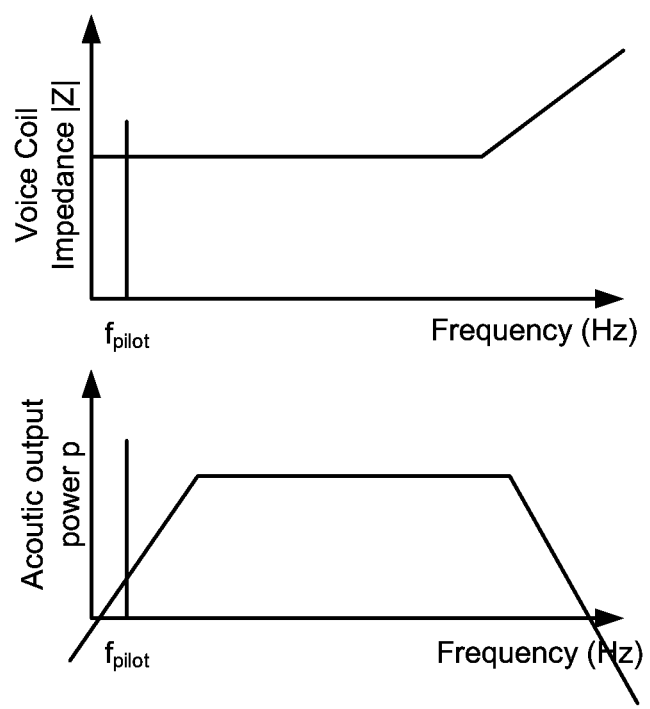
FIG. 5 illustrates the voice coil impedance and acoustic output power response of a typical low impedance.

In some embodiments the test signal may be applied in use. FIG. 5 illustrates, in a general way, the loudspeaker voice coil impedance and the electro-acoustic response versus frequency of a typical loudspeaker. As illustrated, the electrical input impedance of a loudspeaker, for example a small micro-speaker as used in ear-bud type headsets, may be relatively constant over the audio band, whereas the electro-acoustic frequency response may drop off at low and high frequencies. Thus the impedance may be measured, either on initialisation or periodically (i.e. intermittently at regular or irregular intervals or when required) or continuously, by adding a pilot tone at some pilot tone frequency fpilot to the signal path. The pilot tone frequency may be below the acoustic low-frequency cut-off frequency. This pilot tone may provide an appropriate measurement of the coil impedance, but not produce any substantial audible effect. Similarly a pilot tone at a frequency above the audio band may be used, although at higher frequencies some allowance may need to be made for the inductance of the voice coil. In more complex embodiments test signals of multiple frequencies across the audio band or possibly above or below the audio band may be used to characterise the attached load.

In some embodiments the impedance of the load may not be measured directly. For instance the accessory device which is attached to the host device may be capable of indicating its identity via some signalling, which may be analogue or digital or some combination. For example a particular value of resistance may be attached between other poles of a suitable connecter with the value of the resistance being chosen to signal the type of accessory and hence the general impedance band of the load. Some accessory devices may provide a method of digital signalling, at least during an initialisation or discovery phase of operation, which may allow the nominal impedance to be communicated from the particular accessory attached to a host device. In such embodiments the detection module may instead be configured for suitable discovery of the type of connected accessory device and/or communication with the accessory device.

It will be understood that detection of loudspeaker impedance may already be performed in some amplifier circuits for other reasons. For instance loudspeaker protection systems may determine an indication of the loudspeaker impedance as part of ensuring that the loudspeaker is not thermally or mechanically over-loaded. The impedance detection module would therefore already be present in some amplifier circuits and thus does not represent any additional complexity. In any case the functions of the impedance detection module may therefore be shared with other control modules of the amplifier circuitry. For instance a determined value of load impedance may be passed to a circuit controller 209 which controls at least one operating parameter of the amplifier circuitry, for instance the bias current and/or supply voltage supplied to the DAC 201 or amplifier 202.

The determined load characteristic, e.g. the relevant impedance band for the connected load, may be used by the distortion setting controller 107 to select one set {pi}j of a plurality of possible stored sets {pi}1 to {pi}N of coefficients. The sets of coefficients {pi}1 to {pi}N may for instance be stored in a suitable storage module which may comprise a lookup table 210 or the like. The lookup table could for instance be implemented as a bank of memory registers selected via a multiplexor although it will be appreciated that a number of other possibilities are available. The values of the coefficients could be stored in some suitable memory which may be form part of the amplifier circuitry or could be stored elsewhere in the host device.

The selected set of coefficients may then be latched into a register 211 or equivalent. The known current or other stimulus applied to the load by the detection module 106 may then be removed and the normal signal path enabled to allow playback of an audio signal. Enablement and disablement of the normal signal path is illustrated by a switch in series with the output driver amplifier 202, but other means may be employed such as an output driver amplifier with an output stage which may be placed into a high-impedance state when the path is to be disabled. As mentioned above in some embodiments however the applied test signal may be applied via the output driver amplifier 202 or components thereof and thus the signal path would not be disabled.

In some embodiments the register may not be present as an actual separate component. For example the signal may be directly available from the look-up table, in which case the input to the look-up table may be latched in a register or equivalent instead.

In any case the selected set of coefficients are then used by the pre-distortion module to apply an appropriate polynomial first transfer function $p(x)$ to the input signal DIN to provide the controlled distortion as described above to provide a pre-distorted digital signal DPD.

Figure 3:
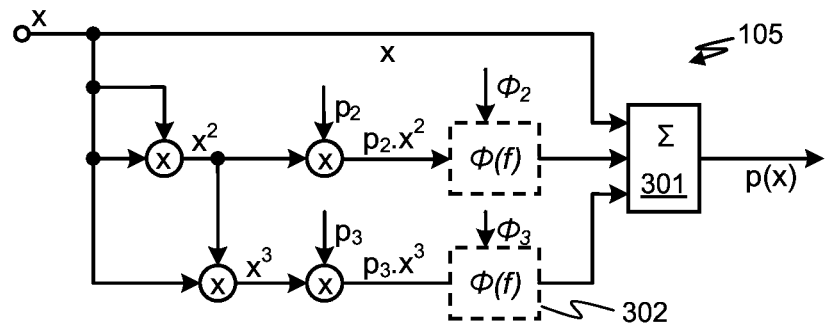
FIG. 3 illustrates one example of a pre-distortion module.

In some embodiments the controlled distortion, i.e. the polynomial first transfer function $p(x)$, may be applied to the signal using dedicated hardware. For example FIG. 3 illustrates one example of a suitable pre-distortion module 105 for applying a controlled distortion which is polynomial function of the third order. The input signal, represented by the term "x", is split into three paths. In a first path the input signal x passes directly to summation block 301. In a second path the input signal x is multiplied by itself and then subsequently by the relevant coefficient p2 before being input to the summation block 301. In the third path the x2 term from the second path is multiplied by the input signal x again and then by the relevant coefficient p3. Equally however the pre-distortion module 105 could be implemented by a suitable a general-purpose digital signal processor (DSP) running appropriate code, which processor may already be performing other processing or pre-conditioning of the audio signal data stream. The appropriate code may be stored in a non-transitory fashion in memory in the host device.

In some embodiments the pre-distortion may be applied according to other transfer functions than a polynomial. For example the transfer function, or its deviation from a constant slope, may be defined in terms of a piecewise linear characteristic, characterised by coefficients denoting break points (abscissae and/or ordinates) between which the transfer function is linearly interpolated. Other possibilities include various known spline methods of interpolating according to fixed parameters or coefficients.

The pre-distorted digital signal DPD is then converted to an analogue signal VPD by DAC 201 and amplified/buffered by driver amplifier 202 to drive the attached load 104. As discussed above, the transfer function from DPD via the DAC 201 and driver amplifier 202 (and any other circuitry in this segment of the audio signal path) may be non-linear with signal according to a non-linear transfer function $k(x)$. The particular set of pre-distortion polynomial coefficients $\{pi\}j$ are chosen on the basis of the load impedance and are designed to aim to substantially cancel, or reduce, at least the major components of distortion induced by the non-linearity of $k(x)$. In other words the pre-distortion components are chosen such that the overall transfer function $k(p(x))$ is constant, say unity, with signal amplitude.

The discussion above has discussed use of a scalar function, for example a real polynomial function, such as a scalar Taylor-type polynomial to compensate for the inherent distortion components. This will provide suitable compensation for a wide variety of cases. It does however assume that the inherent distortion components are phase aligned with fundamental signal. In many cases this assumption will be valid and, as mentioned, such a polynomial function may provide adequate compensation. In at least some embodiments however the components of the amplifier module 103 may be such that at least some inherent distortion components may be out of phase with the fundamental by various amounts.

For instance, if the DAC 201 is a switched-capacitor DAC, distortion originating in the switches of the DAC is typically filtered by infinite-impulse-response (IIR) filtering using switched and un-switched feedback capacitors. This may result in a phase difference which may be sufficient in the audio band to cause imperfect cancellation. In other cases, non-linearities in passive elements may cause distortion that becomes frequency-dependent in conjunction with other passive elements.

In some embodiments therefore at least some distortion coefficients may have an associated phase delay component (which may have a value zero for some coefficients of a given set of coefficients). For example the distortion coefficients could be stored as complex variables, rather than scalar variables, with the magnitude providing the amount of distortion, e.g. p2 and the phase indicating the phase delay, e.g. $\Phi2$. The pre-distortion module may thus be configured to apply the distortion component corresponding to each distortion coefficients so that the applied distortion component is delayed with respect to the fundamental signal by the indicated phase shift.

Referring back to FIG. 3, a pre-distortion module 105 implemented by dedicated circuitry may therefore comprise delays 302 in the paths for deriving the distortion components. The delays 302 may provide a phase delay as a function of frequency and may, for example be provided by an all-pass filter arrangement as would be understood by one skilled in the art.

It should be noted that the operating point of the components of the amplifier module 103 and the various non-linearities may vary with temperature of the amplifier circuitry, e.g. the chip temperature in an integrated circuit embodiment. The transfer function of the inherent distortion $k(x)$ may thus vary with temperature.

The controlled distortion of the first transfer function $p(x)$ applied by the pre-distortion module 105 may be defined according to the most likely operating temperature or mid-range temperature or some other chosen operating point. Such a controlled distortion may function best when the amplifier circuitry is near to the chosen operating point but may still offer improved performance at other operating temperatures compared to applying no controlled distortion. The distortion setting may be defined for each impedance band as the distortion setting that gives the best overall performance across the expected temperature range.

In some embodiments however the at least one distortion setting, i.e. the pre-distortion coefficients, may be selected or generated based on the determined characteristic of the load and also an indication of temperature of the amplifier circuitry. The temperature of the amplifier circuitry may be measured and the distortion coefficients $\{pi\}$ adjusted, possibly according to some previous characterisation of the optimum coefficients versus temperature for the individual device or a representative sample of devices.

Referring back to FIG. 2 a circuit controller 209 may therefore determine an indication of temperature, for example receiving signals from an on-chip temperature sensor 212. The indication of temperature T may be provided to the distortion setting controller module 107 such that the set of coefficients {pi} provided to the pre-distortion module is based on temperature as well as the detected impedance.

There are various ways that coefficients could be adjusted for temperature. For instance the lookup table may include previously determined coefficients for each impedance band at a range of different temperatures. As the temperature changes the most appropriate set of coefficients could be selected based on the characteristic of the load and also the temperature. This would however involve changing the coefficients whilst the amplifier circuitry may be in use. To avoid any step changes in gain causing audible artefacts, the values of the coefficients could be interpolated between discrete entries in the lookup table and/or the coefficients could be varied in a gradual manner, for instance by imposing coefficient ramp rate limitations to avoid artefacts when compensating for a varying chip temperature. Additionally or alternatively the coefficients could be processed to add various post-factors to vary the coefficients in a predetermined way with temperature.

The impedance of the loudspeaker may itself change in use, for example with temperature. In at least some cases the change in impedance of the loudspeaker in use may be over a relatively small range and thus the impedance may remain within the generally selected impedance band. Hence the distortion setting selected by an initial determination of load impedance will be adequate for any changes in impedance that occur in use. In some embodiments however the detection module 105 may be configured to continuously or periodically monitor the impedance of the load in use. If the impedance of the load changes sufficiently the distortion setting may be adjusted accordingly, i.e. the distortion coefficients may be altered in a similar fashion as discussed above in relation to changes in temperature.

As mentioned previously, detection of loudspeaker impedance may already be performed in some amplifier circuits for other reasons, for instance for loudspeaker protection systems. Such speaker protection systems may typically continuously monitor the impedance of the loudspeaker, for example by using an adaptive filter operating as a plant model, attempting to mimic the behaviour of the speaker, on the basis of an indication of the load voltage and load current. Referring back to FIG. 1 the detection module 105 may therefore be configured to continuously monitor the impedance of the connected load and in such a case the function of impedance monitoring may be shared with other functional modules, such as speaker protection system.

The amplifier circuit may in some instances be operable in a number of different operating modes and/or with configurable operating parameters, some of which may alter the inherent distortion characteristic k(x) of the amplifier module 103. For example as described above a circuit controller 209 may adjust operating parameters of the amplifier circuitry, for instance the bias current and/or supply voltage supplied to the DAC 201 or amplifier 202, which may alter the inherent distortion characteristic k(x). The distorting elements in the signal path may be configurable into different operating modes. The operating mode or parameter may be selected based on the determined load impedance and/or may be selected according to other criteria, i.e. in response to other control signals.

For example the amplitude or signal envelope level and/or a volume control signal may influence some operating parameters or an operating mode. The supply voltage to the amplifier may be adjusted with envelope level in a class G type operating mode. Various operating parameters may be controlled in use and at least some changes in operating parameters may also impact the amplifier transfer function k(x) and thus the desired pre-distortion coefficients {pi}. In some embodiments therefore a circuit controller 209 may provide an indication of one or more operating parameters, generally indicated as a mode signal M, to the distortion setting controller 107. As discussed previously the distortion setting, e.g. the set of pre-distortion coefficients {pi} may be selected or adjusted based on the detected load characteristic and also based on the other operating parameters. Again the lookup table may have a plurality of entries for different operating parameters for each impedance band and/or the coefficients may be adjusted or modified in a predetermined manner based on the operating parameters.

It will be noted that various functions have been explained with reference to a circuit controller 209 illustrated in FIG. 2. This controller has been illustrated as a single element in FIG. 2 for clarity but in practice the described functionality may be provided by various different functional blocks. It will also be appreciated that at least some of the functionality of the circuit controller may be included as part of the distortion setting controller.

Note that as used herein the term 'module' shall be used to refer to a functional unit for performing the stated function. A module may be implemented at least partly by dedicated hardware components such as custom defined circuitry and/or at least partly be implemented by one or more software processors or appropriate code running on a suitable general purpose processor or the like. The appropriate code may be stored in memory in the host device. It should also be noted that any circuitry components forming part of one module may be shared with another module and/or the same processor may implement multiple modules and may already be performing other control or data processing, which include other processing of the audio signal, e.g. pre-conditioning of the audio signal data stream.

As described above in various embodiments an appropriate set of distortion coefficients may be generated or selected based on a characteristic of a load connected to the amplifier circuit and used to apply a first transfer function in the signal path, which for at least some loads results in a controlled distortion. The controlled distortion is tailored to at least partly compensate or correct for the inherent distortion of the amplifier circuitry. This improves the distortion characteristics of the resultant output signal, i.e. provides an output signal with lower distortion than otherwise would be the case. This means that relatively small and/or low power components may be used for the amplifier module and the circuit still provides acceptable quality.

As mentioned at least some relevant pre-distortion coefficients may be stored in a suitable store, e.g. a lookup table or the like. This may comprise a dedicated register circuitry or may be some addressable space of memory circuitry also usable for other purposes, e.g. for storing other operational parameters of the host device.

The value of the coefficients which are stored may be generated in a variety of ways. At least some distortion coefficients may be determined by simulating the inherent distortion characteristic, k(x), for the particular amplifier module to be used. The relevant pre-distortion coefficients could then be determined based on the simulated distortion characteristic.

In practice however simulation using normal device models and parasitic extraction methods may, in some cases, not be adequately accurate to achieve desired low levels of distortion in the output signal. In at least some cases therefore the coefficients {pi} may thus be derived empirically as part of a testing or calibration process. For example the coefficients {pi} may be derived empirically by applying test signals to a selection of loads.

Figure 4:
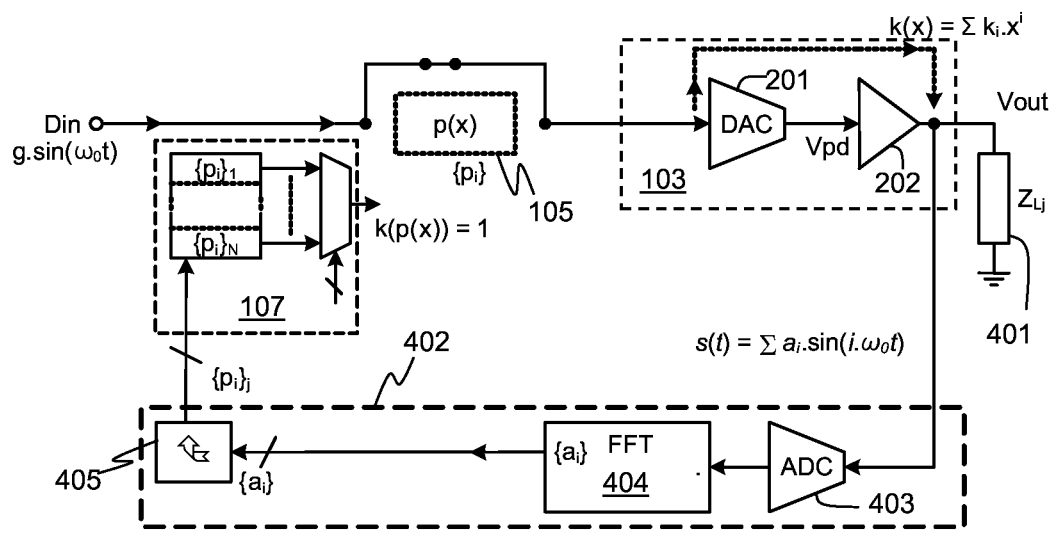
FIG. 4 illustrates one example of a testing arrangement.

FIG. 4 illustrates one example of a test arrangement. An amplifier module 103 under test is connected to a defined impedance ZLi 401. This known impedance may be centred in a desired band of impedance, which may be chosen with regard to the likely types of loads that may be used in practice.

To start the test, the pre-distortion module 105 may be disabled or bypassed so that it doesn't apply any controlled distortion to the input signal DIN. Alternatively the set of coefficients {pi} could each be set to have a value equal to 1.

A defined input test signal is then applied. The test signal may have a form designed to allow characterisation of the response of the amplifier module. The test signal may for instance be a sine wave at an amplitude level corresponding to the level at which it is optimally desired to cancel any distortion, which may for instance be at, or close to, full scale. In some instances the test signal may have a defined frequency modulation or be a multi-tone test signal.

The output signal, i.e. the voltage, at the output of the amplifier module may then be input to a calibration module 402. The output voltage may be sampled by an ADC 403. The ADC 403 may be a high performance ADC to allow accurate capture of the inherent distortion components. In practice the calibration module may be part of an ATE (Automated Test Equipment) machine that is used to calibrate an amplifier circuit, e.g. as part of a factory calibration. In some embodiments however the calibration module 402 may be provided as part of the host device, say as part of an on-chip calibration module for the amplifier circuit. In which case the ADC 403 may be an ADC that forms part of the detection module, say ADC 207. To reduce the requirements of the ADC 403 the ideal or non-distorted output signal may be subtracted from the monitored signal before conversion to leave only the distortion components requiring to be digitised.

With no pre-distortion p(x) applied, the output from the ADC 403 for a certain period of the test signal is passed to a harmonic analyser 404 which may, for example, perform a FFT (Fast Fourier Transform) or Goertzel algorithm to measure the amplitude and polarity of the first few harmonics.

A processor 405 may be configured to transform the amplitude coefficients of the first few (e.g. N) harmonics {ai} of the output signal with no pre-distortion into order N output path polynomial model coefficients {ki} and then invert the polynomial $\Sigma k_i x^i$ to obtain coefficients {pi} of an order N polynomial p(x) that cancels the first N harmonics.

For instance, for a system designed to cancel the second and third harmonics, a signal y may be defined as:

$$y = k(A\sin\omega t) \quad \text{Eqn. (7)}$$
$$= k_1(A\sin\omega t) + k_2(A\sin\omega t)^2 + k_3(A\sin\omega t)^3$$

$$= \frac{k_2 A^2}{2} + \left(k_1 A - \frac{k_3 A^3}{4}\right)\sin\omega t + \frac{k_2 A^2}{2}\cos 2\omega t - \frac{k_3 A^3}{4}\sin 3\omega t$$

By comparing to the coefficients of respective bins in an FFT:

$$= a_0 + a_1 \sin \omega t + a_2 \cos 2\omega - a_3 \sin 3\omega t = a_0 + a_1 \sin \omega t + a_2 \cos 2\omega t - a_3 \sin 3\omega t \quad \text{Eqn. (8)}$$

Then it can be determined that:

$$k_3 = 4\frac{a_3}{A^3} \quad \text{Eqn. (9)}$$
$$k_2 = 4\frac{a_2}{A^1}$$
$$k_1 = \frac{(a_1 + a_3)}{A}$$

One can then calculate $p_2 = -k_2$ and $p_3 = 2.k_2^2 - k_3$ as discussed with respect to Eqn. (4) above.

The process would then be repeated for each of a plurality of different characteristic impedances to generate a set of coefficients {pi} for each impedance band. These sets of coefficients could then be written into some suitable device memory.

If desired the test process could also be conducted at each of a plurality of controlled temperatures of the amplifier module 103 and/or with a plurality of different operating parameters to provide suitable coefficients for a plurality of temperatures and/or operating parameters.

The testing process could be applied to each part produced, i.e. each amplifier circuit, during a manufacturing test. Alternatively a representative sample of parts may be characterised, and suitable coefficients derived from statistical analysis. This would avoid the need for time-consuming, and hence costly, individual calibration. In either case the coefficients may be written to and stored in some programmable non-volatile storage, e.g. EEPROM or OTP. The coefficients may be stored in storage on the same integrated circuit as the amplifier circuitry or elsewhere in a host device.

The calibration process described with reference to FIG. 4 uses an electrical feedback signal from the amplifier module 103. The resulting distortion coefficients will thus compensate for any distortion components in the voltage waveform at the amplifier module when connected to a load of the relevant impedance. In practice however there may however be other distortion downstream of the amplifier module 103, for instance arising from any downstream components, such as perhaps ESD protection components or series switches in the host device. It may therefore be preferred to perform the calibration process and determine the coefficients by monitoring the signal at a downstream point in the host device or even with a typical accessory device connected and by monitoring the audio signal from a point adjacent to the loudspeaker.

No matter how the coefficients are derived, storing the plurality of sets of coefficients allows the amplifier circuitry to be used with a variety of different types of load, e.g. different types of loudspeaker with different impedances, and to apply an appropriate controlled distortion for the circuit when driving that load. This is particularly useful for audio amplifiers that may be used to drive loads that may be removably connected and thus the amplifier circuit may encounter different loads, i.e. impedances, in use. The embodiments described herein may also be useful however even if the amplifier circuitry is actually, in use, embodied in a host device with a non-removable load. The amplifier circuit may be manufactured and calibrated with respect to each of a specified set of ranges of load by one manufacturer, e.g. a chip manufacturer, and then supplied to a different manufacturer for assembly into a final device. For example a headset manufacturer may manufacture at least some headsets with audio driver circuitry in the headset itself, for instance in a dongle. The headset manufacturer may wish to use the same type of amplifier circuit in a range of products with different types of loudspeaker and may not want to have to calibrate the amplifier circuitry or otherwise specify a particular distortion setting. Thus there may be benefit in the amplifier circuitry being able to determine the type of load used. Alternatively the manufactured headset device may include a stored digital code which is provided to the audio driver circuitry to indicate what type of loudspeaker has been used for each particular batch of devices.

Also as mentioned above in some applications the amplifier circuit may respond to any variation in impedance of a given loudspeaker in use.

It will be appreciated that the embodiments described above have been described with reference to a single-ended load with a return to ground. It will of course be appreciated that the output could be an H-bridge type arrangement. The principles of operation would be the as described, except that any sensing of the load voltage may involve differential sensing and any load current measurement may be adapted according to which quadrant of operation is active.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. AS the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more speakers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example. Embodiments of the invention may also be implemented wholly or partially in accessories attachable to a host device, for example, in active speakers or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

What is claimed is:

1. Audio amplifier circuitry comprising:
an amplifier module located in a signal path between an input and an output;
a detection module for detecting a characteristic of a load electrically coupled, in use, to the output;
a distortion setting controller for selecting one of a plurality of stored distortion settings based on the detected characteristic of the load; and
a pre-distortion module configured to apply a first transfer function to a signal in the signal path prior to said amplifier module, wherein the first transfer function is based on the selected distortion setting;
wherein for at least one of the stored distortion settings the corresponding first transfer function comprises a non-linear distortion function;
wherein said characteristic of the load is impedance of the load; and
wherein the distortion setting controller is configured to compare the impedance of the load with one or more threshold values to determine an impedance band for the load and to select one of the stored distortion settings that is appropriate for said impedance band.

2. Audio amplifier circuitry as claimed in claim 1 wherein the first transfer function is based on a polynomial function and each of the stored distortion settings comprises a set of one or more distortion coefficients for said polynomial function.

3. Audio amplifier circuitry as claimed in claim 2 wherein each distortion setting comprises a set of distortion coefficients characterised for a particular load characteristic.

4. Audio amplifier circuitry as claimed in claim 2 wherein at least some distortion coefficients have an associated phase delay component and wherein the pre-distortion module is configured to apply a distortion component corresponding to each distortion coefficient at a respective delay indicated by the respective phase delay component.

5. Audio amplifier circuitry as claimed in claim 1 wherein for one of the stored distortion settings the corresponding first transfer function corresponds to substantially no distortion.

6. Audio amplifier circuitry as claimed in claim 1 further comprising a storage module for storing the plurality of distortion settings.

7. Audio amplifier circuitry comprising:
an amplifier module located in a signal path between an input and an output;
a detection module for detecting a characteristic of a load electrically coupled, in use, to the output;
a distortion setting controller for selecting one of a plurality of stored distortion settings based on the detected characteristic of the load; and a pre-distortion module configured to apply a first transfer function to a signal in the signal path prior to said amplifier module, wherein the first transfer function is based on the selected distortion setting;

wherein for at least one of the stored distortion settings the corresponding first transfer function comprises a non-linear distortion function;

wherein the detection module is coupled to the output of the amplifier circuitry and is configured to determine the characteristic of the load through monitoring of the electrical properties at the output when a load is connected;

wherein the detection module is configured to detect when a load is operably connected to the output and then to determine the characteristic of the load; and wherein, in response to a detection that a load has been operably connected to the output, the amplifier circuitry is configured to apply a test stimulus to the output and the detection module is configured to monitor the electrical properties at the output in response to the test stimulus to determine the characteristic of the load.

8. Audio amplifier circuitry comprising:

an amplifier module located in a signal path between an input and an output;

a detection module for detecting a characteristic of a load electrically coupled, in use, to the output;

a distortion setting controller for selecting one of a plurality of stored distortion settings based on the detected characteristic of the load; and a pre-distortion module configured to apply a first transfer function to a signal in the signal path prior to said amplifier module, wherein the first transfer function is based on the selected distortion setting;

wherein for at least one of the stored distortion settings the corresponding first transfer function comprises a non-linear distortion function;

wherein the detection module is configured to, in use, continuously or periodically monitor the characteristic of the load; and wherein, when the detection module is monitoring the characteristic of the load, the amplifier circuitry is configured to add a pilot tone at a pilot tone frequency to the signal in the signal path and the detection module monitors the electrical properties at the output at said pilot tone frequency.

9. Audio amplifier circuitry comprising:

an amplifier module located in a signal path between an input and an output;

a detection module for detecting a characteristic of a load electrically coupled, in use, to the output;

a distortion setting controller for selecting one of a plurality of stored distortion settings based on the detected characteristic of the load; and a pre-distortion module configured to apply a first transfer function to a signal in the signal path prior to said amplifier module, wherein the first transfer function is based on the selected distortion setting;

wherein for at least one of the stored distortion settings the corresponding first transfer function comprises a non-linear distortion function; and wherein the distortion setting controller is configured such that the selection of the one of the stored plurality of distortion settings is also based on an indication of at least one operating condition of the amplifier circuitry.

10. Audio amplifier circuitry comprising:

an amplifier module located in a signal path between an input and an output;

a detection module for detecting a characteristic of a load electrically coupled, in use, to the output;

a distortion setting controller for selecting one of a plurality of stored distortion settings based on the detected characteristic of the load; and a pre-distortion module configured to apply a first transfer function to a signal in the signal path prior to said amplifier module, wherein the first transfer function is based on the selected distortion setting;

wherein for at least one of the stored distortion settings the corresponding first transfer function comprises a non-linear distortion function; and wherein the distortion setting controller is configured to modify the selected distortion setting based on an indication of at least one operating condition of the amplifier circuitry.

11. Audio amplifier circuitry as claimed in claim 10 wherein the at least one operating condition of the amplifier circuitry comprises temperature of the amplifier circuitry.

12. Audio amplifier circuitry as claimed in claim 10 wherein the at least one operating condition of the amplifier circuitry comprises at least one of: a supply voltage; a bias current; an amplifier operating mode.

13. Audio amplifier circuitry comprising:

an amplifier module located in a signal path between an input and an output;

a detection module for detecting a characteristic of a load electrically coupled, in use, to the output;

a distortion setting controller for selecting one of a plurality of stored distortion settings based on the detected characteristic of the load; and a pre-distortion module configured to apply a first transfer function to a signal in the signal path prior to said amplifier module, wherein the first transfer function is based on the selected distortion setting;

wherein for at least one of the stored distortion settings the corresponding first transfer function comprises a non-linear distortion function; and wherein the distortion setting controller is configured, such that, in the event that the selected distortion setting is changed in use, to transition from the old distortion setting to the new distortion setting via at least one intermediate setting value.

14. An electronic device comprising audio amplifier circuitry as claimed in any preceding claim wherein the electronic device is at least one of: a communications device; a computing device; a portable device; a battery powered device; a wearable device; a gaming device; a mobile telephone; a laptop, notebook or tablet computer.

* * * * *

UNITED STATES PATENT AND TRADEMARK OFFICE
CERTIFICATE OF CORRECTION

PATENT NO. : 9,866,180 B2
APPLICATION NO. : 14/707846
DATED : January 9, 2018
INVENTOR(S) : Lesso et al.

It is certified that error appears in the above-identified patent and that said Letters Patent is hereby corrected as shown below:

In the Drawings

In Fig. 5, Sheet 3 of 3, delete "Acoutic" and insert -- Acoustic --, therefor.

In the Specification

In Column 3, Line 28, delete "load; and" and insert -- load; --, therefor.

In Column 4, in Table 1, under "Example Impedance Band", Line 1, delete "Z < 1000" and insert -- Z < 100 Ω --, therefor.

In Column 9, Line 8, delete "mode" and insert -- mode. --, therefor.

In Column 11, Line 3, delete "may be form" and insert -- may form --, therefor.

In Column 13, Lines 37-38, delete "detection module 105" and insert -- detection module 106 --, therefor.

In Column 13, Lines 52-53, delete "detection module 105" and insert -- detection module 106 --, therefor.

In Column 16, Lines 2-4, delete "$= \dfrac{k_2 A^2}{2} + \left(k_1 A - \dfrac{k_3 A^3}{4}\right) \sin\omega t + \dfrac{k_2 A^2}{2} \cos 2\omega t -$"

and insert -- $= \dfrac{k_2 A^3}{2} + \left(k_1 A - \dfrac{k_3 A^2}{4}\right) \sin\omega t + \dfrac{k_2 A^2}{2} \cos 2\omega t -$ --, therefor.

Signed and Sealed this
Second Day of October, 2018

Andrei Iancu
*Director of the United States Patent and Trademark Office*

CERTIFICATE OF CORRECTION (continued)  
U.S. Pat. No. 9,866,180 B2

In Column 16, Lines 11-12, delete "$=a_0+a_1 \sin \omega t+a_2 \cos 2\omega-a_3 \sin 3\omega t=a_0+a_1 \sin \omega t++a_2 \cos 2\omega t-a_3 \sin 3\omega t$" and insert --$=a_0+a_1 \sin \omega t+a_2 \cos 2\omega t-a_3 \sin 3\omega t=a_0+a_1 \sin \omega t+a_2 \cos 2\omega t-a_3 \sin 3\omega t$--, therefor.

In Column 16, Lines 18-19, delete "$k_2 = 4\dfrac{a_2}{A^1}$" and insert --$k_2 = 4\dfrac{a_3}{A^3}$--, therefor.